United States Patent
Huang et al.

(10) Patent No.: US 7,253,519 B2
(45) Date of Patent: Aug. 7, 2007

(54) CHIP PACKAGING STRUCTURE HAVING REDISTRIBUTION LAYER WITH RECESS

(75) Inventors: Min-Lung Huang, Kaohsiung (TW); Chi-Long Tsai, Taitung (TW); Chao-Fu Weng, Tainan (TW); Ching-Huei Su, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/709,953

(22) Filed: Jun. 9, 2004

(65) Prior Publication Data

US 2004/0245630 A1 Dec. 9, 2004

(30) Foreign Application Priority Data

Jun. 9, 2003 (TW) .............................. 92115490 A

(51) Int. Cl.
*H01L 23/48* (2006.01)
*H01L 23/28* (2006.01)
*H01L 23/31* (2006.01)
*H01L 23/485* (2006.01)

(52) U.S. Cl. .............................. 257/738; 257/E23.021; 257/E23.069; 257/E23.02; 257/E23.179; 257/734; 257/737; 257/758; 257/781; 257/782; 257/783; 257/773; 257/772; 257/774; 257/780; 257/761; 257/766; 257/764; 257/765; 257/763

(58) Field of Classification Search ........ 257/E23.069, 257/E23.021, E23.02, E23.179, 737, 734, 257/738, 700, 701, 758, 781–783, 772–774, 257/779, 780, 761, 763–766
See application file for complete search history.

(56) References Cited

U.S. PATENT DOCUMENTS

| | | | | |
|---|---|---|---|---|
| 5,508,229 A * | 4/1996 | Baker | .......................... | 438/614 |
| 5,898,223 A * | 4/1999 | Frye et al. | .................. | 257/777 |
| 5,960,308 A * | 9/1999 | Akagawa et al. | ........... | 438/613 |
| 6,239,482 B1 * | 5/2001 | Fillion et al. | ................ | 257/678 |
| 6,287,893 B1 * | 9/2001 | Elenius et al. | .............. | 438/108 |
| 6,332,988 B1 * | 12/2001 | Berger et al. | ................ | 216/100 |
| 6,333,565 B1 * | 12/2001 | Hashimoto | ................... | 257/781 |
| 6,452,270 B1 * | 9/2002 | Huang | ........................ | 257/738 |
| 6,492,198 B2 * | 12/2002 | Hwang | ........................ | 438/108 |
| 6,545,225 B2 * | 4/2003 | Copetti et al. | .............. | 174/260 |
| 6,583,516 B2 * | 6/2003 | Hashimoto | ................... | 257/781 |
| 6,756,688 B2 * | 6/2004 | Narizuka et al. | ........... | 257/779 |
| 6,781,234 B2 * | 8/2004 | Hayashida | ................... | 257/738 |
| 6,867,122 B2 * | 3/2005 | Weng | ........................... | 438/614 |
| 6,885,101 B2 * | 4/2005 | Storli | ........................... | 257/737 |
| 6,930,389 B2 * | 8/2005 | Huang | ......................... | 257/737 |
| 6,939,789 B2 * | 9/2005 | Huang et al. | ................ | 438/612 |

(Continued)

*Primary Examiner*—Alexander Oscar Williams
(74) *Attorney, Agent, or Firm*—Jiang Chyun IP Office

(57) ABSTRACT

A chip structure comprising a chip, a redistribution layer, a second passivation layer and at least a bump is provided. The chip has a first passivation layer and at least a bonding pad. The first passivation layer exposes the bonding pad and has at least a recess. The redistribution layer is formed over the first passivation layer and electrically connected to the bonding pad. Furthermore, the redistribution layer also extends from the bonding pad to the recess. The second passivation layer is formed over the first passivation layer and the redistribution layer. The second passivation layer also has an opening that exposes the redistribution layer above the recess. The bump passes through the opening and connects electrically with the redistribution layer above the recess.

18 Claims, 5 Drawing Sheets

U.S. PATENT DOCUMENTS

| | | | |
|---|---|---|---|
| 6,977,403 B2 * | 12/2005 | Seto et al. | 257/299 |
| 7,012,334 B2 * | 3/2006 | Liu et al. | 257/737 |
| 2002/0020855 A1 * | 2/2002 | Hwang | 257/200 |
| 2003/0098494 A1 * | 5/2003 | Liu et al. | 257/529 |
| 2003/0119298 A1 * | 6/2003 | Hayashida | 438/612 |
| 2003/0124496 A1 * | 7/2003 | Hough | 434/226 |
| 2003/0211720 A1 * | 11/2003 | Huang et al. | 438/613 |
| 2004/0238957 A1 * | 12/2004 | Akram et al. | 257/738 |
| 2004/0266163 A1 * | 12/2004 | Horng | 438/614 |
| 2005/0017355 A1 * | 1/2005 | Chou et al. | 257/738 |
| 2005/0017361 A1 * | 1/2005 | Lin et al. | 257/756 |
| 2005/0020047 A1 * | 1/2005 | Mis et al. | 438/597 |

* cited by examiner

CHIP PACKAGING STRUCTURE HAVING REDISTRIBUTION LAYER WITH RECESS

CROSS REFERENCE TO RELATED APPLICATIONS

This application claims the priority benefit of Taiwan application serial no. 92115490, filed on Jun. 9, 2003.

BACKGROUND OF INVENTION

1. Field of Invention

The present invention relates to a chip structure. More particularly, the present invention relates to a chip with structural reinforcement between a bump on an under-bump metallurgy layer and a redistribution layer.

2. Description of Related Art

In the flip chip package technology, the chip is flipped over and then attached to a substrate or a printed circuit board (PCB). On the active surface of the chip, the bonding pads are arranged in area arrays, and an under-bump-metallurgy layer and a bump such as a solder bump are sequentially formed over each of the bonding pads. Then, the chip is flipped over and attached to the contacts on the surface of the substrate or a printed circuit board (PCB) via the bumps. The flip chip bonding technology is suitable to be used to fabricate chip packages with high pin counts. Due to the advantages of reducing package dimension and shortening signal transmission path in the package structure, the flip chip package technology has been widely adopted in the package fabrication.

As flip chip packages become popular, more and more products are packaged using the flip chip technique. However, changing the original chip design to fit the packaging mode is highly uneconomical. Hence, bonding pad redistribution technique has been developed to serve as a compromise to bridge the gap in this transition stage. Through a redistribution layer on the surface of a chip, the bonding pads close to the periphery region originally for bonding with bonding wires are redistributed into an array that facilitates the attachment of bumps in preparation for forming a flip chip package.

FIG. 1 is schematic cross-sectional view of a conventional chip structure. As shown in FIG. 1, the chip structure 100 mainly comprises a chip 110, a redistribution layer 120, a passivation layer 130 and at least a bump 150. The chip 110 has an active surface 112, a passivation layer 114 and at least a bonding pad 116. The passivation layer 114 and the bonding pad 116 are disposed on the active surface 112 of the chip 110. The passivation layer 114 exposes the bonding pad 116. The passivation layer 114 is fabricated using an inorganic compound including silicon oxide or silicon nitride, for example. The redistribution layer 120 is electrically connected to the bonding pad 116. The passivation layer 130 is formed over the redistribution layer 120. The passivation layer 130 has at least an opening 132 with sidewalls perpendicular to the active surface 112 of the chip 110 for exposing a portion of the redistribution layer 120. It should be noted that a conventional redistribution layer 120 is a composite stack film including four metallic layers such as titanium/copper titanium/copper. Thus, the redistribution layer 120 is able to serve also as an under-bump-metallurgy layer. The bump 150 is directly connected to the redistribution layer 120 exposed by the opening 132. Since SnPb alloy has a better bonding properties, the bump is normally fabricated using SnPb alloy having a Sn/Pb weight ratio between 63:37 to 5:95.

Because the bump 150 is connected to the redistribution layer 120 via the opening 132 in the passivation layer 130, the probability of the flip chip cracking or peeling is high during a shearing test. In other words, the lifetime of the chip will be reduced.

SUMMARY OF INVENTION

Accordingly, the present invention provides a chip structure capable of maintaining a strong bonding strength between a bump and the node of a redistribution layer for a prolonged period so that overall lifetime of the chip is increased.

According to an embodiment of the present invention, the chip structure comprising a chip, a redistribution layer, a second passivation layer and at least a bump is provided. The chip has a first passivation layer and at least a bonding pad. The bonding pad is exposed by the first passivation layer, and the first passivation layer has at least a recess. The redistribution layer is formed over the first passivation layer and is electrically connected to the bonding pad. Furthermore, the redistribution layer extends from the bonding pad to the recess. The second passivation layer having an opening that exposes the redistribution layer above the recess is formed over the first passivation layer and the redistribution layer. The bump is electrically connected with the redistribution layer above the recess via the opening.

According to the embodiment of this invention, an obtuse angle is formed between a sidewall of the recess and a bottom surface of the recess. Similarly, an obtuse angle is formed between a sidewall of the opening and a bottom surface of the opening. In addition, the chip structure of the invention further comprises at least an under-bump-metallurgy layer disposed between the exposed redistribution layer and the bump.

According to one preferred embodiment of this invention, the under-bump-metallurgy layer is a composite stack film including a first metallic layer, a second metallic layer and a third metallic layer, for example. The first metallic layer is formed over the exposed redistribution layer. The second metallic layer is formed over the first metallic layer. The third metallic layer is formed over the second metallic layer. The first metallic layer is fabricated using a material including, for example, aluminum, titanium, titanium-tungsten alloy, tantalum, tantalum nitride or chromium. The second metallic layer is fabricated using a material including, for example, nickel-vanadium alloy or copper-chromium alloy. The third metallic layer is fabricated using a metal such as copper or an alloy. The under-bump-metallurgy layer further comprises at least an electroplated layer over the third metallic layer. The electroplated layer is an electroplated copper layer, an electroplated or electroless plated nickel layer, an electroless plated gold layer or combination thereof.

According to one preferred embodiment of this invention, the under-bump-metallurgy layer is a composite stack film including a first metallic layer and a second metallic layer. The first metallic layer is formed over the exposed redistribution layer. The second metallic layer is formed over the first metallic layer. The first metallic layer is fabricated using a material including, for example, aluminum, titanium, titanium-tungsten alloy, tantalum, tantalum nitride or chromium. The second metallic layer is fabricated using a metallic material such as copper or an alloy. The under-bump-metallurgy layer further comprises at least an eletroplated layer over the second metallic layer. The electroplated layer is, for example, an electroplated copper layer, an electroplated, an electroless plated nickel layer, an electroless plated gold layer or combination thereof.

According to one preferred embodiment of this invention, the redistribution layer is a composite stack film including a first metallic layer, a second metallic layer and a third metallic layer. The first metallic layer is formed over the first passivation layer. The second metallic layer is formed over the first metallic layer. The third metallic layer is formed over the second metallic layer. The first metallic layer is fabricated using a material including, for example, aluminum, titanium, titanium-tungsten alloy, tantalum, tantalum nitride or chromium. The second metallic layer is fabricated using a material including, for example, nickel-vanadium alloy or copper-chromium alloy. The third metallic layer is fabricated using a metal such as copper or an alloy.

According to one preferred embodiment of this invention, the redistribution layer is a composite stack film including a first metallic layer and a second metallic layer. The first metallic layer is formed over the first passivation layer. The second metallic layer is formed over the first metallic layer. The first metallic layer is fabricated using a material including, for example, aluminum, titanium, titanium-tungsten alloy, tantalum, tantalum nitride or chromium. The second metallic layer is fabricated using a metal such as copper or an alloy.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
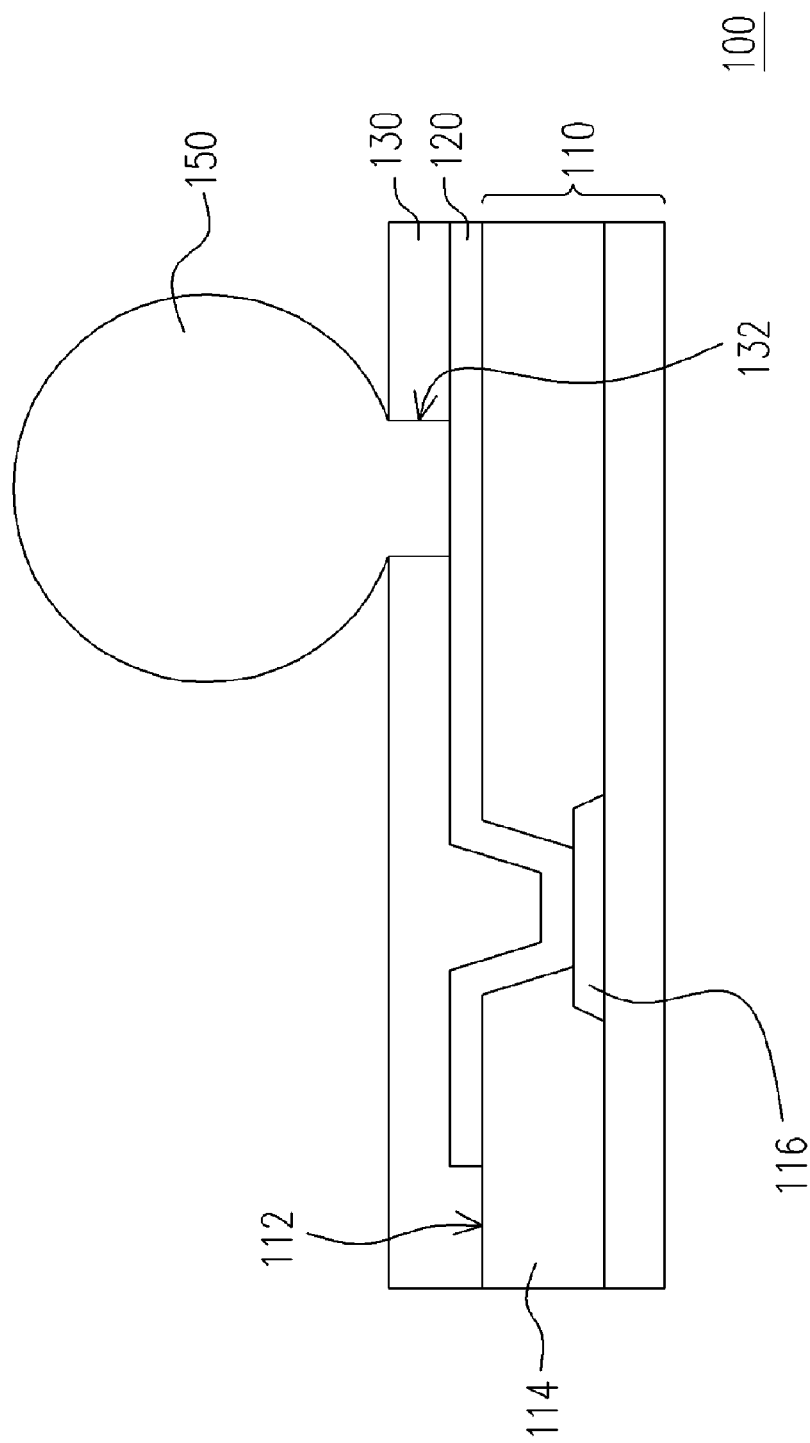
FIG. 1 is schematic cross-sectional view of a conventional chip structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
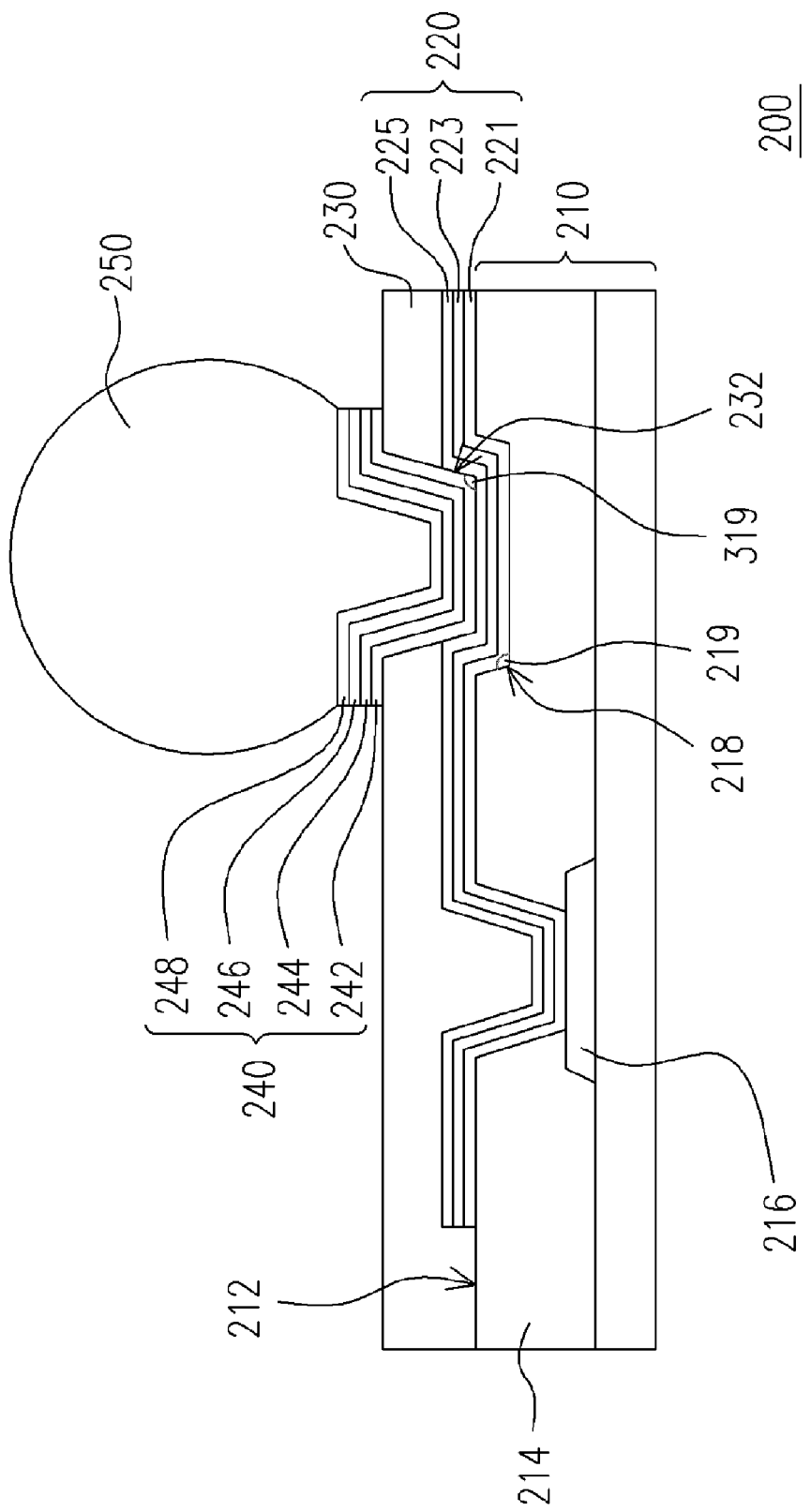
FIG. 2 is a schematic cross-sectional view of a chip structure according to one preferred embodiment of this invention.

FIG. 2 is a schematic cross-sectional view of a chip structure according to an embodiment of the present invention. As shown in FIG. 2, the chip structure 200 mainly comprises a chip 210, a redistribution layer 220, a passivation layer 230 and at least a bump 250. The chip 210 has an active surface 212, a passivation layer 214 and at least a bonding pad 216. The passivation layer 214 and the bonding pad 216 are formed on the active surface 212 of the chip 210. Furthermore, the bonding pad 216 is exposed by the passivation layer 214. It should be note that the passivation layer 214 has at least a recess 218. The recess 218 has a wide-top narrow-bottom cross-sectional profile similar to a trapezium. In other words, an obtuse angle 219 is formed between a sidewall of the recess 218 and a bottom surface of the recess 218.

In this embodiment, the chip 210 is fabricated using a semiconductor material including silicon or germanium, for example. The passivation layer 214 is fabricated using a material including, for example, silicon oxide, silicon nitride or phosphosilicate glass (PSG). The passivation layer 214 is a composite stack film including alternately stacked layers of the aforementioned inorganic compound. The bonding pad 216 is fabricated using a metallic material such as aluminum or copper.

Figure 3:
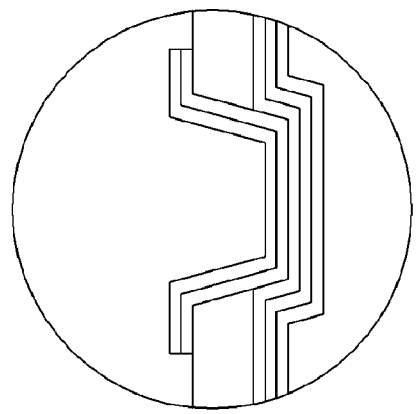
FIG. 3 is a cross-sectional diagram showing the redistribution layer in FIG. 2 matching with another under-bump-metallurgy layer.

The redistribution layer 220 is formed over the passivation layer 214 and is electrically connected to the bonding pad 216. Furthermore, the redistribution layer 220 extends from the bonding pad 216 to the recess 218. A portion of the redistribution layer 220 is located over the passivation layer 214 above the recess 218. As shown in FIG. 3, the redistribution layer 220 is a composite stack film including three metallic layers 221, 223 and 225. The metallic layer 221 is formed over the passivation layer 214. The metallic layer 223 is formed over the metallic layer 221 and the metallic layer 225 is formed over the metallic layer 223. It should be noted that the metallic layer 221 is fabricated using aluminum, titanium, titanium-tungsten alloy, tantalum, tantalum nitride or chromium, for example. The metallic layer 223 is fabricated using nickel-vanadium alloy or chromium-copper alloy, for example. The metallic layer 225 is fabricated using a metallic material such as copper or an alloy.

The passivation layer 230 having an opening 232 is formed over the passivation layer 214 and the redistribution layer 220. A portion of the redistribution layer 220 above the recess 218 is exposed by the opening 232. Furthermore, the opening 232 has a top-wide, bottom-narrow cross-section similar to a trapezium. In other words, an obtuse angle 319 is formed between a sidewall of the opening 232 and a bottom surface of the opening 232.

The bump 250 is disposed over the redistribution layer 220 exposed by the opening 232 of the passivation layer 230. The bump 250 is electrically connected to the redistribution layer 220 above the recess 218. The bump 250 is fabricated using material such as Sn—Pb alloy with a Sn/Pb weight ratio of 63% to 37% or a Sn/Pb ratio of 5% to 95% or a composite bump with different Sn/Pb weight ratio. Through the profile and angle 219 of the recess 218, the bonding strength between the redistribution layer 220 and the bump 250 is strengthened.

Aside from connecting the bump 250 directly to the re-distribution layer 220 exposed by the opening 232, an additional under-bump-metallurgy layer 240 may be formed between the redistribution layer 220 and the bump 250 to increase their bonding strength even further. The following describes in more detail the structural relationship and connection of the under-bump-metallurgy layer 240 with its neighboring layers.

As shown in FIG. 2, an under-bump-metallurgy layer 240 may optionally be disposed on a portion of the passivation layer 230 and the redistribution layer 220 exposed by the opening 232 of the passivation layer 230. In the chip structure, the under-bump-metallurgy layer 240 is preferably disposed between the redistribution layer 220 and the bump 250. The under-bump-metallurgy layer 240 is a composite stack film including three metallic layers 242, 244 and 246, for example. The metallic layer 242 is formed over the redistribution layer 220 exposed by the opening 232. The metallic layer 244 is formed over the metallic layer 242 and the metallic layer 246 is formed over the metallic layer 244. The metallic layer 242 serves to increase the bonding strength between the redistribution layer 220 and the metallic layer 244. The metallic layer 244 serves to prevent possible migration of tin from the bump 250 and cause unwanted structure damage or signal transmission degradation. The metallic layer 246 serves to increase the adhesive strength between the under-bump-metallurgy layer 240 and the bump 250 so that the bump 250 can easily adhere to the under-bump-metallurgy layer 240, for example.

In addition, an electroplated layer 248 is also formed over the metallic layer 246. The electroplated layer 248 is formed between the third metallic layer 246 and the bump 250, for example. It should be noted that the metallic layer 222 is fabricated using aluminum, titanium, titanium-tungsten alloy, titanium nitride, tantalum, tantalum nitride or chromium, for example. The metallic layer 224 is fabricated using nickel-vanadium alloy or chromium-copper alloy, for example. The metallic layer 226 is fabricated using a metallic material such as copper or an alloy. The electroplated layer 248 is an electroplated copper layer, an electroplated, an electroless nickel layer, an electroless plated gold layer or combination thereof.

Figure 5:
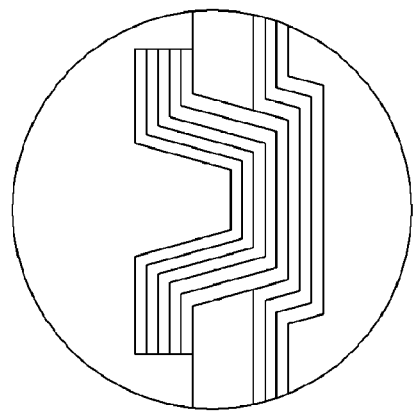
FIG. 5 is a cross-sectional diagram showing the redistribution layer in FIG. 2 matching with yet another under-bump-metallurgy layer.
Figure 4:
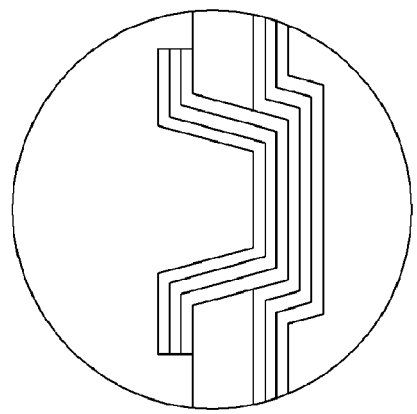
FIG. 4 is a cross-sectional diagram showing the redistribution layer in FIG. 2 matching with yet another under-bump-metallurgy layer.

The aforementioned structure is constructed using a redistribution layer with three metallic layers and an under-bump-metallurgy layer with four metallic layers. However, this invention also permits other combinations such as a three-layered redistribution layer with a two-layered under-bump-metallurgy layer (as shown in FIG. 3), a three-layered redistribution layer with a three-layered under-bump-metallurgy layer (as shown in FIG. 4), a three-layered redistribution layer with a five-layered under-bump-metallurgy layer (as shown in FIG. 5).

When the under-bump-metallurgy layer 240 is formed over the redistribution layer 220 exposed by the opening 232 of the passivation layer 230, the bump 250 is connected to the redistribution layer 220 above the recess 218 via the under-bump-metallurgy layer 240. Hence, the bump 250 on the under-bump-metallurgy layer 240 has a better structural strength. The higher structural strength prevents the bump 250 from cracking or peeling during the under-bump-metallurgy layer and leads to a longer lifetime for the chip structure.

Figure 6:
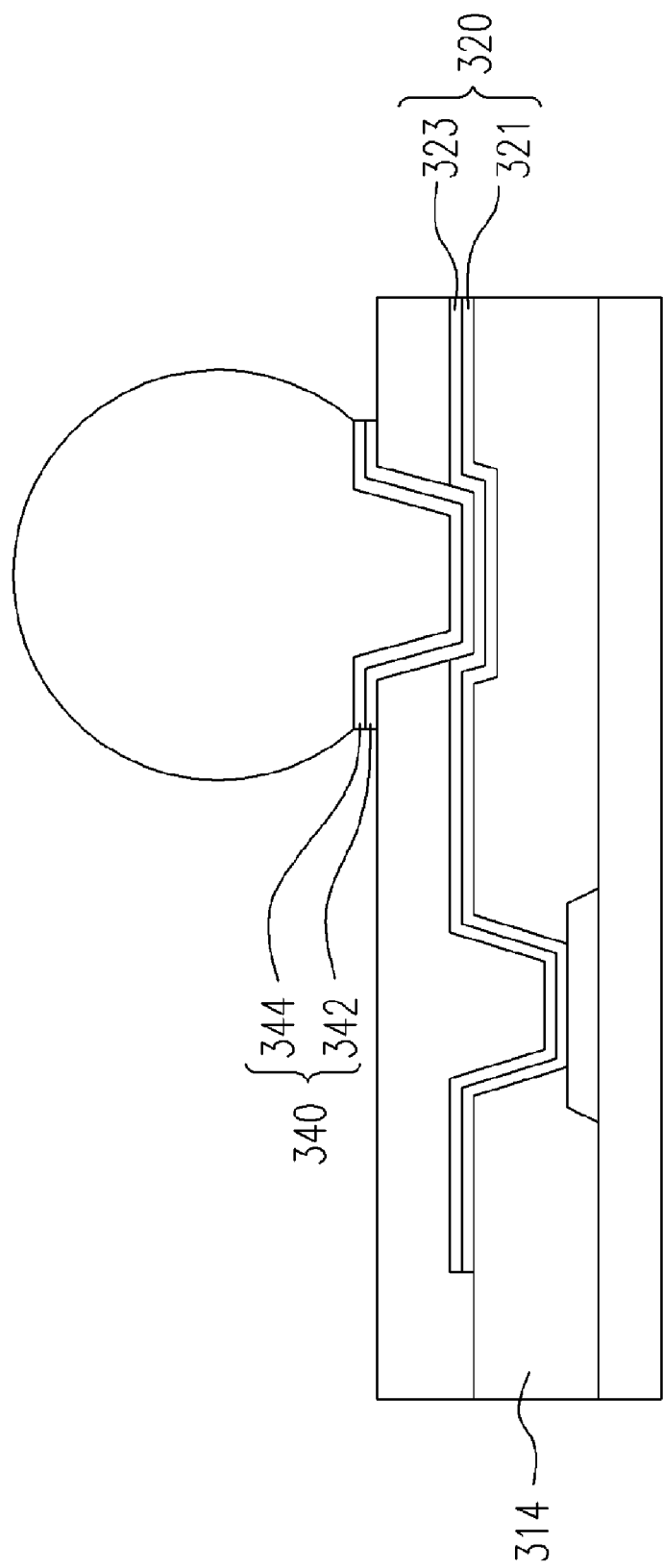
FIG. 6 is a schematic cross-sectional view of a chip structure according to another preferred embodiment of this invention.

FIG. 6 is a schematic cross-sectional view of a chip structure according to another embodiment of this invention. As shown in FIG. 6, the redistribution layer 320 comprises two metallic layers 321 and 323. The metallic layer 321 is formed over the passivation layer 314 and the metallic layer 323 is formed over the metallic layer 321. It should be noted that the metallic layer is fabricated using aluminum, titanium, titanium-tungsten alloy, titanium nitride, tantalum, tantalum nitride or chromium. The metallic layer 323 is fabricated using copper, for example.

The under-bump-metallurgy layer 340 also comprises two metallic layers 342 and 344. The metallic layer 342 is formed over the redistribution layer 320 and the metallic layer 344 is formed over the metallic layer 342. It should be noted that the metallic layer 342 is fabricated using aluminum, titanium, titanium-tungsten alloy, titanium nitride, tantalum, tantalum nitride or chromium. The metallic layer 344 is fabricated using copper, for example.

Figure 9:
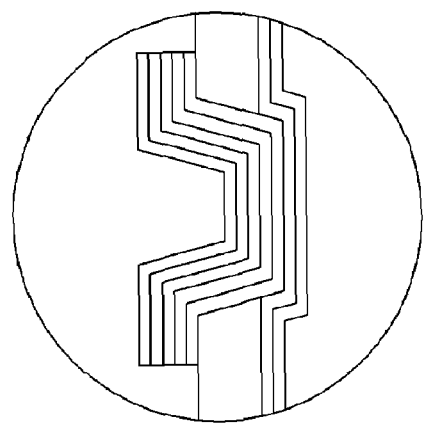
FIG. 9 is a cross-sectional diagram showing the redistribution layer in FIG. 6 matching with yet another under-bump-metallurgy layer.
Figure 8:
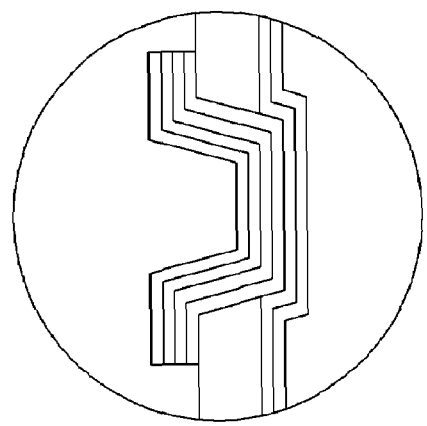
FIG. 8 is a cross-sectional diagram showing the redistribution layer in FIG. 6 matching with yet another under-bump-metallurgy layer.
Figure 7:
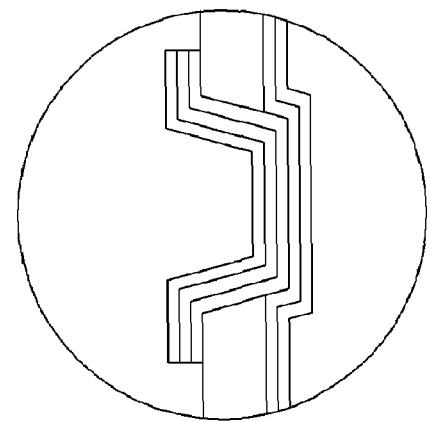
FIG. 7 is a cross-sectional diagram showing the redistribution layer in FIG. 6 matching with another under-bump-metallurgy layer.

The aforementioned structure is constructed using a redistribution layer with two metallic layers and an under-bump-metallurgy layer with two metallic layers. However, this invention also permits other combinations such as a two-layered redistribution layer with a three-layered under-bump-metallurgy layer (as shown in FIG. 7), a two-layered redistribution layer with a four-layered under-bump-metallurgy layer (as shown in FIG. 8), a two-layered redistribution layer with a five-layered under-bump-metallurgy layer (as shown in FIG. 9).

In summary, the chip structure according to this invention has at least the following advantages:

1. The recess in the passivation layer is able to strengthen the bond between the bump and the redistribution layer so that the bump has an enhanced structural strength.

2. This invention is also able to maintain a strong bond between the bump and the redistribution layer for a prolonged period, thereby increasing the overall lifetime of the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A chip packaging structure, comprising:
  a chip having a first passivation layer and at least a bonding pad, wherein the bonding pad is exposed by the first passivation layer and the first passivation layer has at least a recess, the whole recess has a sidewall and a bottom surface being exposed;
  a redistribution layer formed over the first passivation layer, wherein the redistribution layer electrically connects with the bonding pad and extends from the bonding pad to the recess, and in contact with the sidewall and the bottom surface of the recess and the redistribution layer further comprises:
    a first metallic layer formed over the first passivation layer, wherein a material constituting the first metallic layer is selected from the group consisting of aluminum, titanium, titanium-tungsten alloy, tantalum, tantalum nitride and chromium;
    a second metallic layer formed over the first metallic layer; and
    a third metallic layer formed over the second metallic layer;
  a second passivation layer formed over the first passivation layer and the redistribution layer, wherein the second passivation layer has an opening that exposes the redistribution layer above the recess; and
  at least a bump disposed inside the opening and electrically connected to the redistribution layer above the recess.

2. The chip packaging structure of claim 1, wherein the recess has an obtuse angle and is formed between the sidewall of the recess and the bottom surface of the recess.

3. The chip packaging structure of claim 1, further comprising at least an under-bump-metallurgy layer formed in the opening of the second passivation layer and extending over an upper surface of the second passivation layer, wherein the hump is on the under-bump-metallurgy layer and electrically connected to the redistribution layer above the recess.

4. The chip structure of claim 3, wherein the under-bump-metallurgy layer further comprises:
a first metallic layer formed over the opening-exposed redistribution layer; and
a second metallic layer formed over the first metallic layer.

5. The chip structure of claim 4, wherein a material constituting the first metallic layer is selected from the group consisting of aluminum, titanium, titanium-tungsten alloy, tantalum, tantalum nitride and chromium.

6. The chip structure of claim 4, wherein a material constituting the second metallic layer comprises copper.

7. The chip structure of claim 4, wherein the under-bump-metallurgy layer further comprises at least an electroplated layer formed over the second metallic layer and the electroplated layer is selected from the group consisting of an electroplated copper layer, an electroplated nickel layer, an electroless nickel layer, an electroless plated gold layer and combination thereof.

8. The chip packaging structure of claim 3, wherein the under-bump-metallurgy layer further comprises:
a first metallic layer formed over the opening-exposed redistribution layer;
a second metallic layer formed over the first metallic layer; and
a third metallic layer formed over the second metallic layer.

9. The chip packaging structure or claim 8, wherein a material constituting the first metallic layer is selected from the group consisting of aluminum, titanium, titanium-tungsten alloy, tantalum, tantalum nitride and chromium.

10. The chip packaging structure of claim 8, wherein a material constituting the second metallic layer is selected from the group consisting of nickel-vanadium alloy and copper-chromium alloy.

11. The chip packaging structure of claim 8, wherein a material constituting the third metallic layer comprises copper.

12. The chip packaging structure of claim 8, wherein the under-bump-metallurgy layer further comprises at least an electroplated layer formed over the third metallic layer and the electroplated layer is selected from the group consisting of an electroplated copper layer, an electroplated nickel layer, an electroplated gold layer and combination thereof.

13. The chip packaging structure of claim 1, wherein a material constituting the second metallic layer comprises copper.

14. A chip packaging structure, comprising:
a chip haying a first passivation layer and at least a bonding pad, wherein the bonding pad is exposed by the first passivation layer and the first passivation layer has at least a recess, the whole recess has a sidewall and a bottom surface being exposed;
a redistribution layer formed over the first passivation layer, wherein the redistribution layer electrically connects with the bonding pad and extends from the bonding, pad to the recess, and in contact with the sidewall and the bottom surface of the recess and the redistribution layer further comprises:
a first metallic layer formed over the first passivation layer;
a second metallic layer formed over the first metallic layer, wherein a material constituting the second metallic layer is selected from the group consisting of nickel-vanadium alloy and copper-chromium alloy, and
a third metallic layer formed over the second metallic layer;
a second passivation layer formed over the first passivation layer and the redistribution layer, wherein the second passivation layer has an opening that exposes the redistribution layer above the recess; and
at least a bump disposed inside the opening and electrically connected to the redistribution layer above the recess.

15. The chip packaging structure of claim 14, wherein a material constituting the third metallic layer comprises copper.

16. The chip packaging structure of claim 1, wherein an obtuse angle is formed between a sidewall of the opening and a bottom surface of the opening.

17. The chip packaging structure of claim 14, wherein the recess has an obtuse angle and is formed between the sidewall of the recess and the bottom surface of the recess.

18. The chip packaging structure of claim 14, further comprising at least an under-bump-metallurgy layer formed in the opening of the second passivation layer and extending over an upper surface of the second passivation layer, wherein the bump is on the under-bump-metallurgy layer and electrically connected to the redistribution layer above the recess.

* * * * *